United States Patent
Furusho et al.

(10) Patent No.: US 6,247,942 B1
(45) Date of Patent: Jun. 19, 2001

(54) CONNECTOR FOR IC CARD, HAVING SHIELDING PLATES

(75) Inventors: Hidetaka Furusho; Kazuki Satou; Waratu Oguchi, all of Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/637,181

(22) Filed: Aug. 11, 2000

(30) Foreign Application Priority Data

Sep. 9, 1999 (JP) .................................................. 11-255257

(51) Int. Cl.[7] .................................................. H01R 13/648

(52) U.S. Cl. ........................... 439/108; 439/159; 439/607

(58) Field of Search .............................. 439/64, 108, 607, 439/159

(56) References Cited

U.S. PATENT DOCUMENTS

| | | | |
|---|---|---|---|
| 5,389,001 | * | 2/1995 | Broschard, III et al. ............ 439/159 |
| 5,795,190 | | 8/1998 | Ono ....................................... 439/607 |
| 6,059,588 | * | 5/2000 | Tung et al. ........................... 439/159 |
| 6,071,149 | * | 6/2000 | Hara ..................................... 439/607 |
| 6,083,018 | * | 7/2000 | Hara et al. ........................... 439/159 |

* cited by examiner

*Primary Examiner*—Tulsidas Patel
(74) *Attorney, Agent, or Firm*—Beyer Weaver & Thomas, LLP

(57) ABSTRACT

A connector for IC card, comprising a housing with plural connecting terminals attached thereto, a shielding plate disposed on the housing, and a circuit board on which the housing and the shielding plate are mounted, wherein the shielding plate is formed with a grounding portion, an end of the grounding portion being extended and bent to form a bent portion as a swivel-stop portion for the nut.

4 Claims, 7 Drawing Sheets

CONNECTOR FOR IC CARD, HAVING SHIELDING PLATES

BACKGROUND OF THE INVENTION

1. Field of the Invention

The present invention relates to a structure of a connector for IC card to be used as a storage medium in a personal computer or the like. Particularly, the invention is concerned with a grounding structure of shielding plates.

2. Description of the Prior Art

As an expanded memory for a personal computer there generally is employed a connector for IC card, and as a storage medium for such an IC card connector, an IC card has come to be used widely. On the IC card is mounted an IC (integrated circuit) for the storage of various information pieces, and for preventing a malfunction of the IC, a dimple (a grounding piece) for grounding is provided on a peripheral surface of the IC card, which dimple functions to prevent the influence of a bounce noise generated within the circuit or an external noise entering from the exterior.

It is known that also on the IC card connector side for the loading of such an IC card with dimple there is mounted a shielding plate for preventing the influence of such bounce noise or external noise as referred to above.

For example, according to a known structure of a shielding plate used in an IC card connector, an electrically conductive metallic plate as a shielding plate is disposed on either an upper surface side or a lower surface side of a connector housing. This shielding plate is disposed so as to cover upper surfaces of plural contact terminals fixed to the connector housing and is centrally formed with plural contact pieces capable of contacting a dimple of an IC card.

Further, at both ends of the shielding plate are formed grounding portions capable of contacting a grounding pattern formed on a circuit board onto which the connector housing is mounted and fixed. By forming screw inserting holes respectively in the grounding portions and by fixing the grounding portions to the circuit board with screws and nuts there are effected both grounding of the shielding plate to the grounding pattern and fixing of the housing to the circuit board.

However, in the above conventional shielding plate structure for an IC card connector, both end portions of the shielding plate are extended, then screw inserting holes are formed respectively in the thus-extended portions, and the grounding portions thus formed with the screw inserting holes are screwed to the circuit board with screws and nuts and are thereby fixed onto the circuit board. However, since there is no swivel stop for the nuts, it is necessary to hold down each nut with a jig or the like during the screw tightening work, resulting in that the same work becomes troublesome.

Both end portions of the housing may be partially cut out along the shape (hexagon) of each nut to form swivel-stop portions for the nuts, but resinous swivel stops are apt to slip and low in strength, thus giving rise to problems in machinability and assembling reliability.

SUMMARY OF THE INVENTION

Accordingly, it is an object of the present invention to solve the above-mentioned problems and provide a structure of a shielding plate in an IC card connector which, when a grounding portion of the shielding plate is fixed with screw and nut onto a circuit board, can provide a swivel stop of a simple structure for the nut.

For achieving the above-mentioned object, in one aspect of the present invention there is provided a connector for IC card, comprising a housing with plural connecting terminals attached thereto, a shielding plate disposed on the housing, and a circuit board on which the housing and the shielding plate are mounted, wherein the shielding plate is formed with a grounding portion, an end of the grounding portion being extended and bent to form a bent portion as a swivel-stop portion for a nut.

In another aspect of the present invention, the nut is disposed between the grounding portion and the bent portion, a tip end of the bent portion is bent to an upper side of the nut, and a side wall of the bent portion is brought into engagement with an outer side face of the nut to provide a swivel stop for the nut.

In a further aspect of the present invention, a cutout portion for avoiding abutment against a screw is formed in the bent tip end of the bent portion.

In a still further aspect of the present invention, the cutout portion is formed along an outer periphery of the screw, and the bent tip end is extended so as to cross the screw.

DETAILED DESCRIPTION OF A PREFERRED EMBODIMENT

Figure 1:
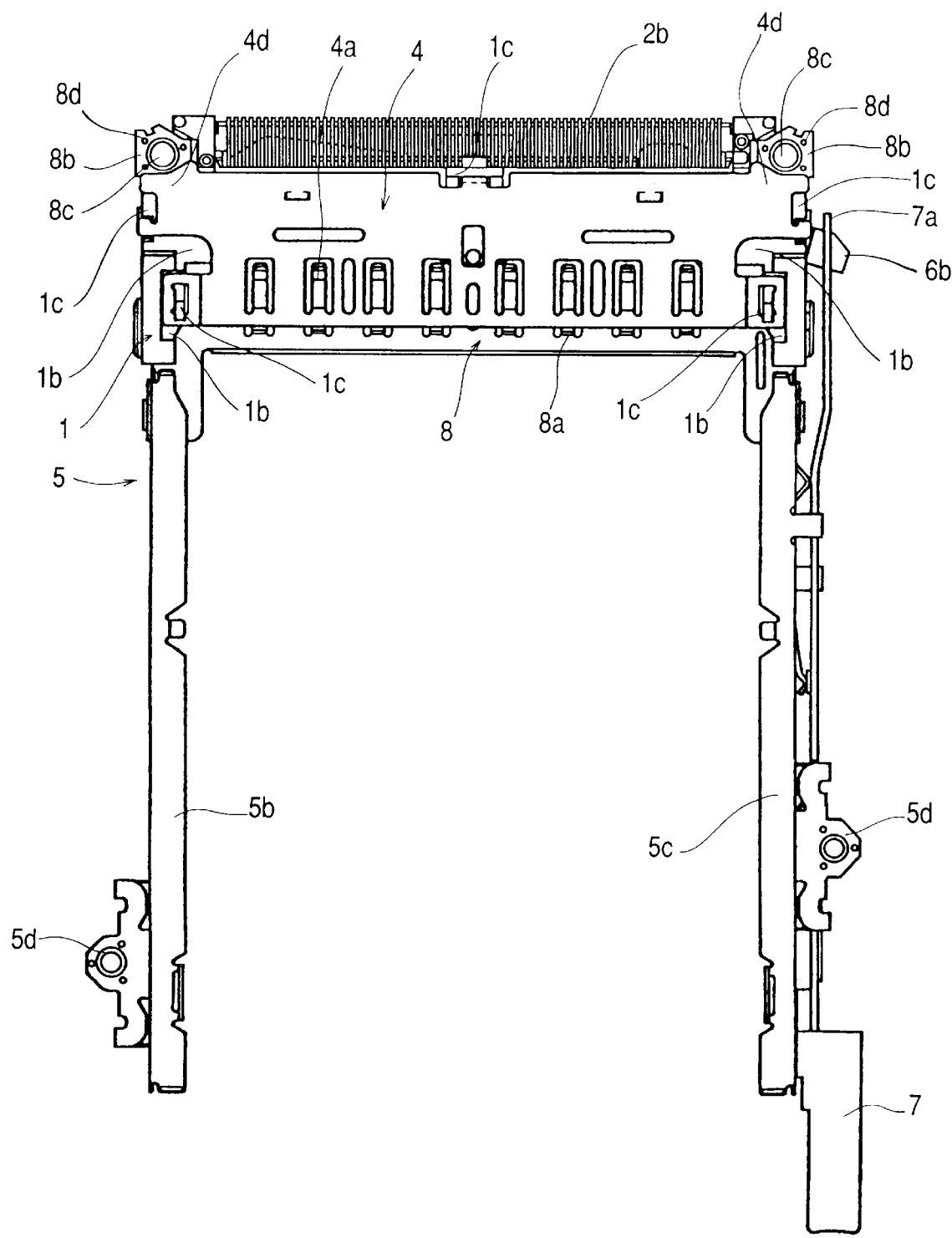
FIG. 1 is a bottom view of a connector for IC card according to an embodiment of the present invention.
Figure 2:
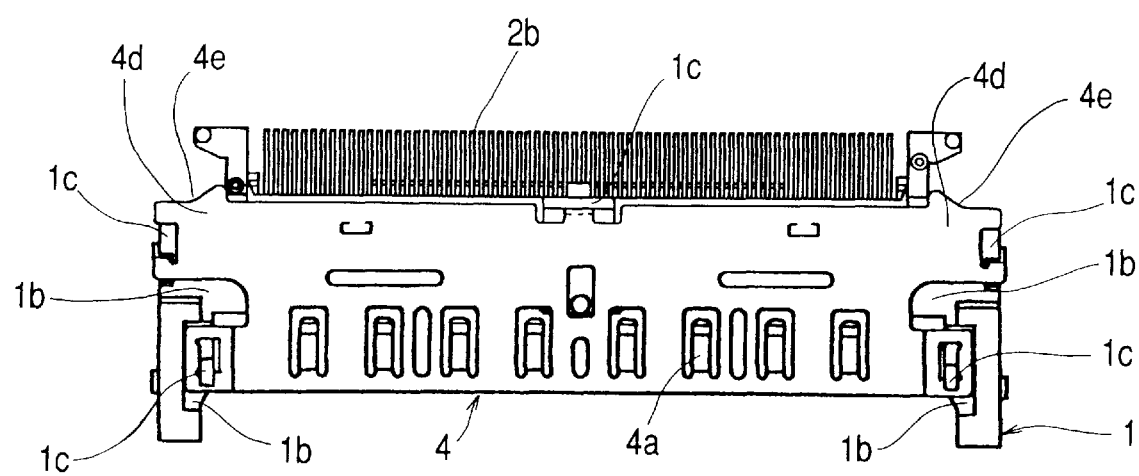
FIG. 2 is a bottom view showing a fixed state of a housing and a first shielding plate.
Figure 3:
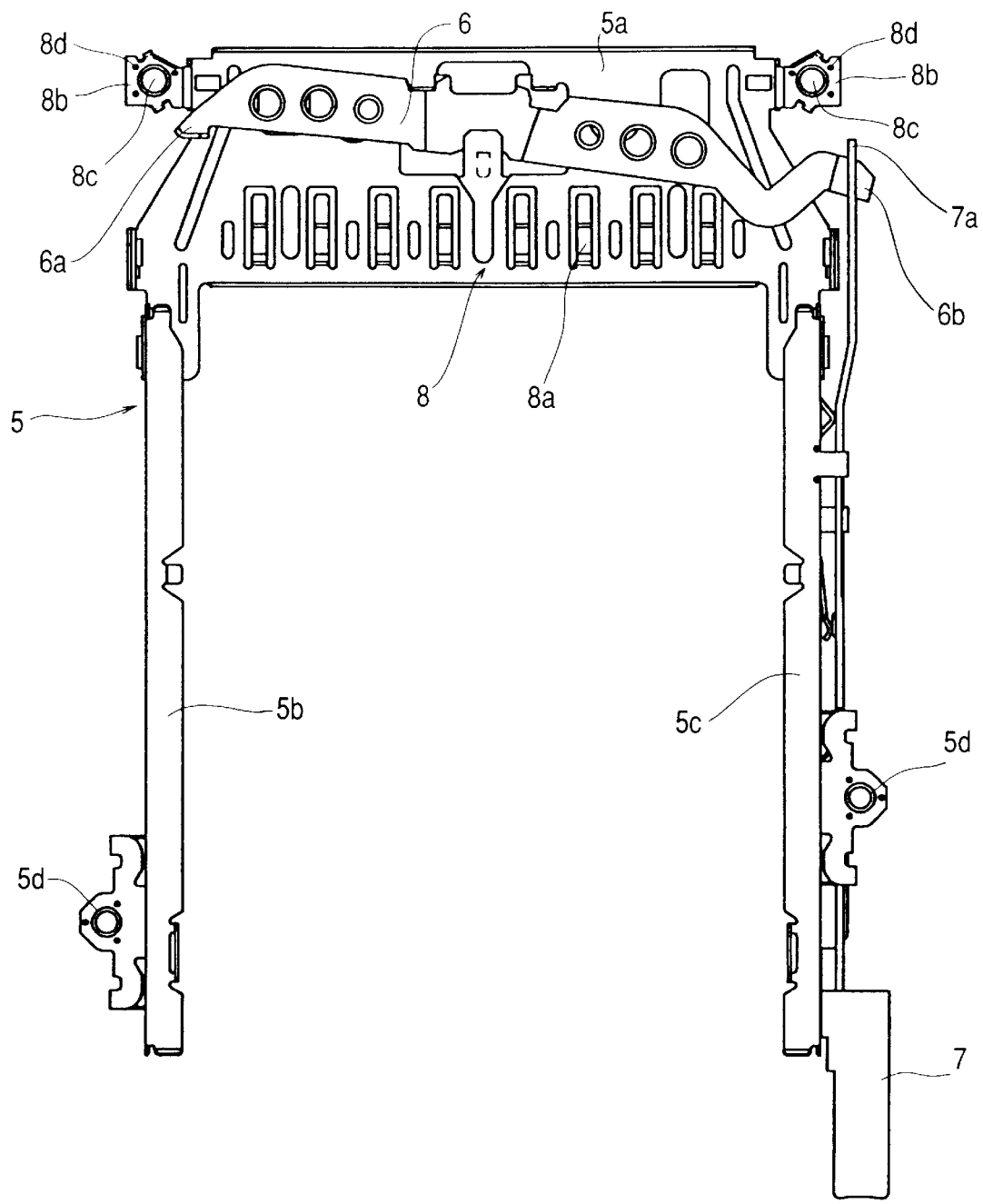
FIG. 3 is a bottom view showing a frame and a second shielding plate.
Figure 4:
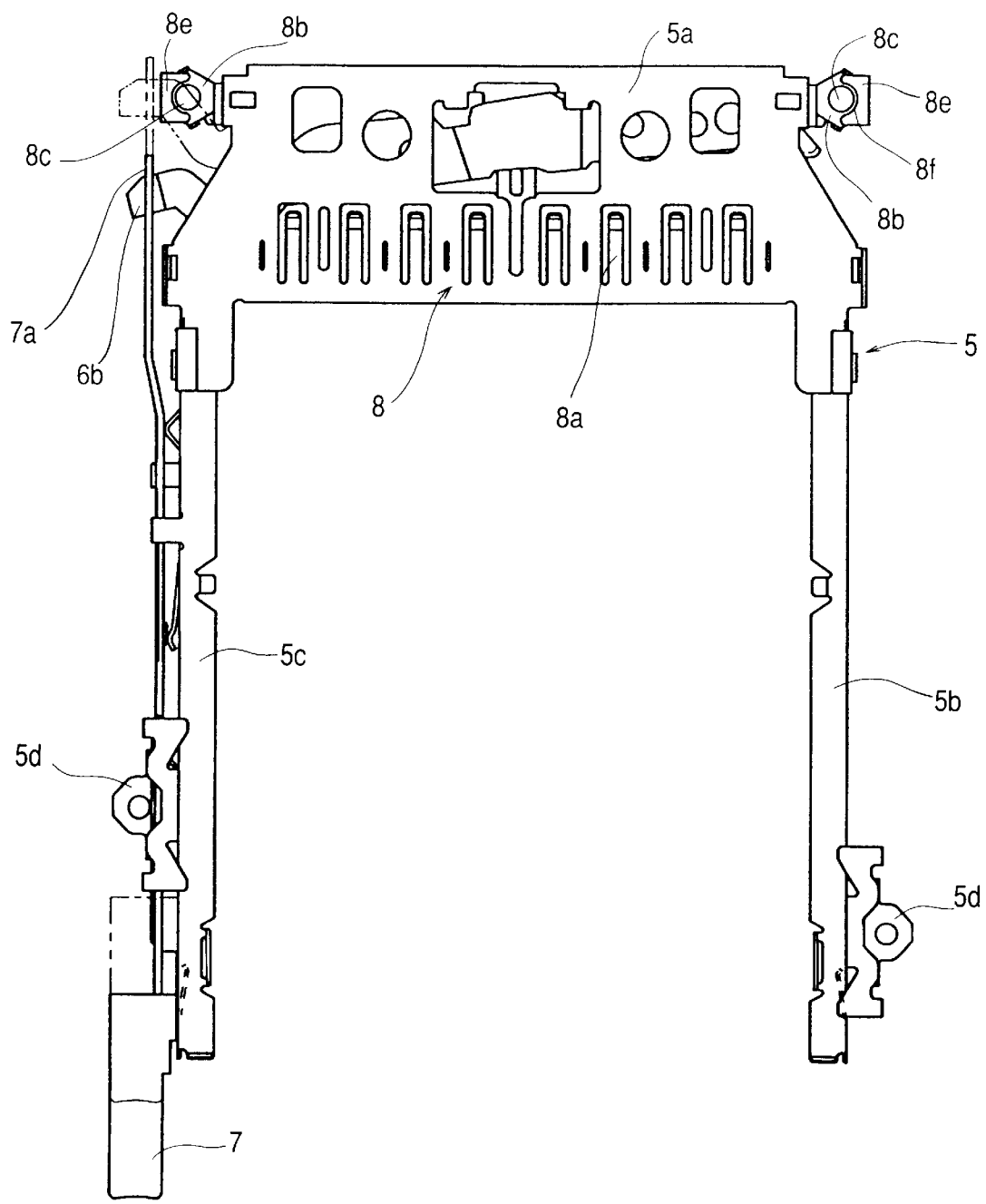
FIG. 4 is a top view thereof.
Figure 5:
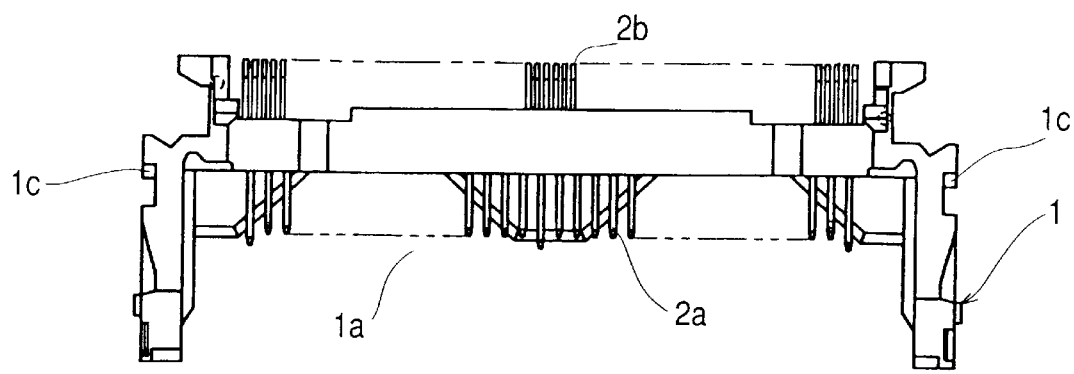
FIG. 5 is a top view of the housing.
Figure 6:
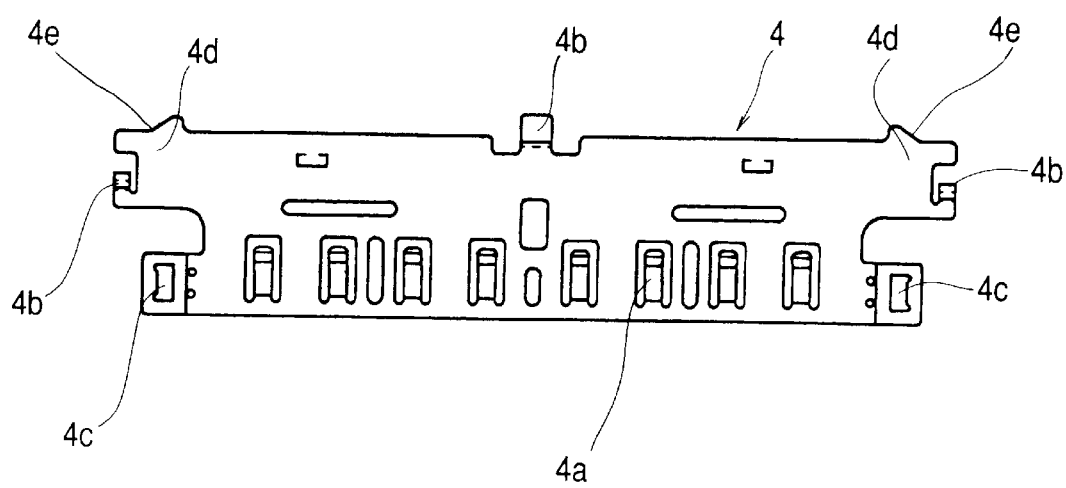
FIG. 6 is a top view of the first shielding plate.
Figure 7:
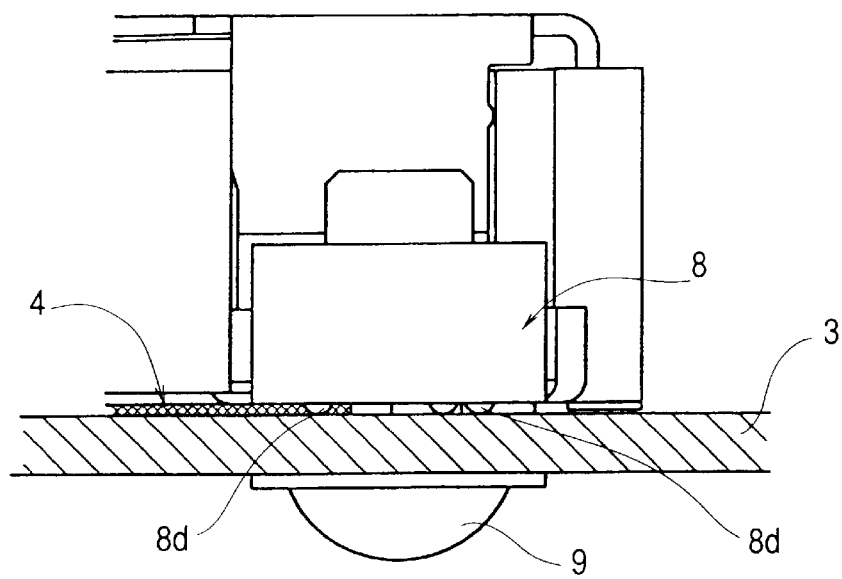
FIG. 7 is an explanatory diagram showing a grounded state of grounding portions of the first and second shielding plates.
Figure 8:
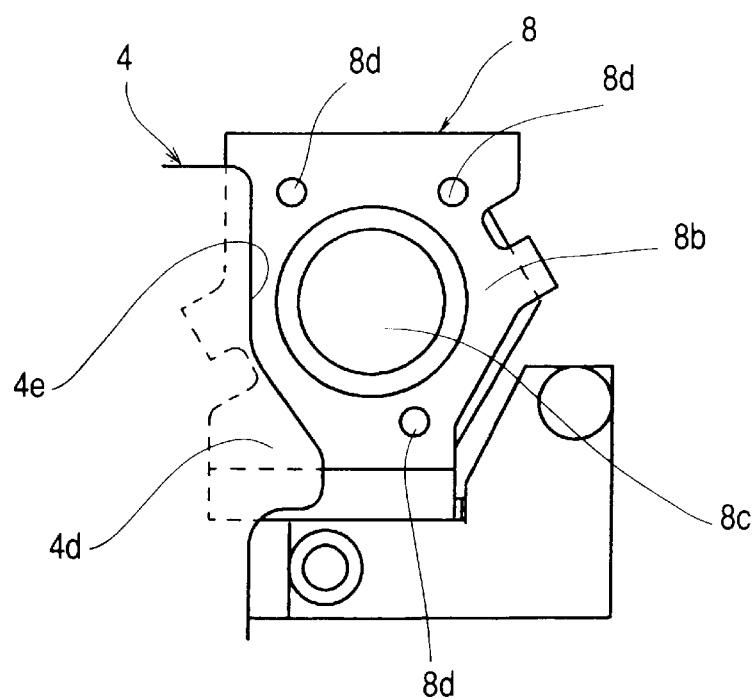
FIG. 8 is an explanatory diagram showing a superposed state of the grounding portions of the first and second shielding plates.
Figure 9:
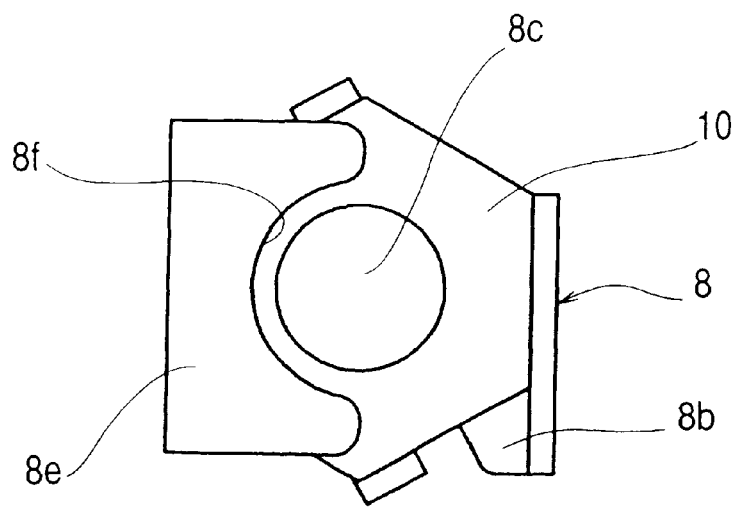
FIG. 9 is a plan view showing a swivel-stop portion for a nut.
Figure 10:
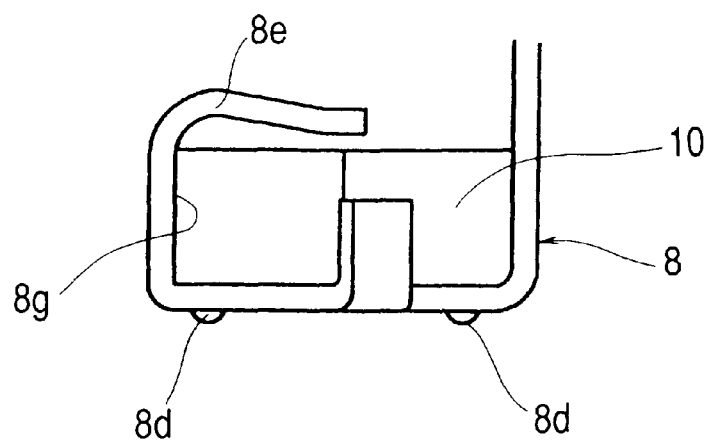
FIG. 10 is a side view thereof.

An embodiment of the present invention is illustrated in FIGS. 1 to 10, of which FIG. 1 is a bottom view of a connector of IC card embodying the present invention, FIG. 2 is a bottom view showing a fixed state of a housing and a first shielding plate, FIG. 3 is a bottom view of a frame and a second shielding plate, FIG. 4 is a top view thereof, FIG. 5 is a top view of the housing, FIG. 6 is a top view of the first shielding plate, FIG. 7 is an explanatory diagram showing a grounded state of grounding portions of the first and second shielding plates, FIG. 8 is an explanatory diagram showing a superposed state of the grounding portions of the first and second shielding plates, FIG. 9 is a plan view of a swivel-stop portion for a nut, and FIG. 10 is a side view thereof.

In the figures, a housing 1 is formed of an insulating material such as a synthetic resin, with a loading portion 1a for insertion therein of an IC card being formed in the housing 1. On an inner bottom of the loading portion 1a are arranged a plurality of contact terminals 2a formed of an electrically conductive metallic material. Opposite end sides of the contact terminals 2a are drawn out to the exterior of the housing 1 and connecting terminals 2b are formed for connection with circuit patterns (not shown) formed on a circuit board on which the connector is mounted.

On both upper and lower surface sides of the housing 1 are formed accommodating recesses 1b for accommodating therein shielding plates which will be described later. The accommodating recesses 1b are each formed at a depth substantially equal to the thickness of each shielding plate so as to be substantially flush with the upper and lower surfaces of the housing 1 when the shielding plates are mounted into the accommodating recesses 1b.

The housing 1 is provided with plural engaging portions 1c for engagement with the shielding plates.

The shielding plates comprise first and second shielding plates. The first shielding plate, indicated at 4, is formed by an electrically conductive metallic plate such as a phosphor bronze plate. The first shielding plate 4 is cut and raised centrally to form a plurality of contact pieces 4a for contact with a dimple (a grounding pieces) of an IC card (not shown). Centrally at one side of the first shielding plate 4 and at both end portions thereof there are formed engaging pieces 4b and engaging holes 4c to be engaged with and positioned by the housing 1.

Further, at both end portions of the first shielding plate 4 are formed grounding portions 4d to be overlapped with the second shielding plate which will be described later. In the grounding portions 4d are formed relief portions 4d as cutout portions respectively. The relief portions 4e are for avoiding overlapping with protuberances formed on the second shielding plate when the grounding portions 4d are superposed on the second shielding plate.

A frame 5 is formed in a general U shape using an electrically conductive metallic plate such as a phosphor bronze plate. Centrally of the frame 5 is provided a flat plate-like base portion 5a which is integral with the second shielding plate to be described later. At both ends of the base portion 5a are formed a pair of guide portions 5b and 5c along which an IC card is inserted and removed and which are extended substantially in parallel with each other.

An ejection lever 6 is secured to the base portion 5a of the frame 5. The ejection lever 6 is held pivotably at a central part thereof. At one free end of the ejection lever 6 is formed an arm portion 6a for abutment against an IC card to eject the card, while at an opposite free end of the ejection lever 6 is formed a drive end portion 6b which projects from a side face of the base portion 5a.

An ejection knob 7 for ejecting an IC card is attached slidably to one guide portion 5c of the paired guide portions 5b and 5c. At a tip end of the ejection knob 7 is formed an operating end 7a for engagement with the drive end portion 6b of the ejection lever 6. By engagement of the operating end 7a with the drive end portion 6b and with a pushing motion of the ejection knob 7, the arm portion 6a formed at a free end of the ejection lever 6 moves pivotally to eject the IC card loaded between the guide portions 5b and 5c.

The guide portions 5b and 5c are respectively formed with mounting portions 5d for mounting the frame 5 with screws when the frame is put for fixing onto the circuit board 3.

The second shielding plate, indicated at 8, is integral with the base portion 5a of the frame 5 which is formed by an electrically conductive metallic plate such as a phosphor bronze plate. The second shielding plate 8 is formed in a position opposed to the first shielding plate 4 which is engaged with the housing 1. Like the first shielding plate 4, the second shielding plate 8 is cut and raised centrally to form a plurality of contact pieces 8a for contact with a dimple (a grounding piece) of an IC card (not shown).

At both end portions of the second shielding plate 8 are formed grounding portions 8b to be overlapped with the first shielding plate 4, the grounding portions 8b extending outward and being formed in plural steps. The grounding portions 8b are centrally formed with screw inserting holes 8c respectively for insertion therein of screws to fix the frame 5 onto the circuit board 3, which fixing operation is performed in cooperation with the mounting portions 5d of the guide portions 5b and 5c.

In this embodiment, the second shielding plate 8 is mounted on an upper surface side of the housing 1 and the first shielding plate 4 is mounted on a lower surface side of the housing (the circuit board 3 side).

On the grounding portion 8b are formed a plurality of protuberances 8d projecting to the circuit board 3 side in such a manner that the height of each protuberance 8d is almost equal to the thickness of each grounding portion 4d of the first shielding plate 4. By so restricting the projecting size of the protuberances 8d, when the grounding portions 4d of the first shielding plate 4 and the grounding portions 8b of the second shielding plate 8 are superposed one on the other, the protuberances 8d of the second shielding plate 8 and lower surfaces of the grounding portions 4d of the first shielding plate 4 become flush with an upper surface of the circuit board 3, thus permitting both grounding portions to be grounded simultaneously.

In this case, since the grounding portions 4d of the first shielding plate 4 are respectively formed with relief portions 4e to avoid overlapping with the protuberances 8d, the grounding portions 4d and 8b can be grounded simultaneously in a superposed state of the first and second shielding plates 4, 8.

According to the above construction, since the plural contact terminals 2a formed on the housing 1 are covered with the first and second shielding plates 4, 8 from both upper and lower surface sides of the housing 1, it is possible to minimize the influence of a bounce noise in the circuit and an external noise. Besides, since the grounding portions 4d and 8b can be superposed and fixed together with bolts, a simple structure can be realized.

Moreover, the accommodating recesses 1b for accommodating therein the first and second shielding plates 4, 8 are formed in the upper and lower surfaces of the housing 1 at about the same depth as the thickness of each shielding plate so as to be substantially flush with the upper and lower surfaces of the housing when the shielding plates 4 and 8 are received in the recesses 1b. Thus, the reduction of thickness can be attained without increase in external form of the housing 1.

In this embodiment, if the first shielding plate 4 positioned on the circuit board 3 side is not mounted with the intention of reducing the number of components used for example, only the grounding portions 8b of the second shielding plate 8 are grounded to the circuit board 3. In this case, since the protuberances 8d are formed, a gap corresponding to the thickness of the first shielding plate 4 is prevented from being formed between the second shielding plate and the circuit board 3, which gap would cause a poor contact.

Thus, components can be used in common to both the product wherein the first and second shielding plates 4, 8 are mounted on both lower and upper surfaces of the housing 1 and the product wherein the first shielding plate 4 on the lower surface side is not used.

Each grounding portion 8b is formed with a bent portion 8e formed by extending an end of the grounding portion 8b and bending it in a general U shape. In a tip end of the bent portion 8e is formed a generally U-shaped cutout 8f. The cutout 8f is formed by allowing an end of the grounding portion 8b to extend along an outer periphery of a mounting screw 9 and allowing a tip end thereof to cross the screw 9. The bent portion 8e serves as a swivel-stop portion for a nut 10 which is fitted on the mounting screw 9.

Since the cutout 8f is formed in the bent portion 8e, even when the bent portion 8e is bent to an upper side of the nut 10 to sandwich the nut between the tip end of the bent portion 8e and the grounding portion 8b, it is possible to avoid abutment against the portion of the screw 9 which portion projects from the nut 10. Besides, machining is easy because the tip end of the bent portion 8e can be formed in a long extended state.

Since the bent portion 8e is formed in the grounding portion 8b, the mounting nut 10 is retained between the grounding portion 8b and the bent portion 8e. Further, since the tip end of the bent portion 8e is bent to the upper side of the nut 10 and a side wall 8g of the bent portion 8e is brought into engagement with an outer side face of the nut 10 to serve as a swivel stop for the nut, it is possible to realize a simple construction, easy machining, and reliable swivel prevention.

According to the above construction, since the swivel-stop portion for the mounting nut 10 is formed integrally with the grounding portion 8b, the construction is simplified; besides, since it is formed by bending a tip end of the grounding portion, it is easy to effect machining and the swivel-stop portion can be positively brought into engagement with the nut 10 without the need of enhancing the machining accuracy and assembling accuracy, thus ensuring swivel stop.

In the IC card connector according to the present invention, as set forth above, a shielding plate is formed with grounding portions, ends of the grounding portions being extended and bent to form bent portions as swivel-stop portions for nuts. With such a simple construction and without the need of enhancing the machining accuracy and assembling accuracy, it is possible to provide a positive swivel stop.

Each nut is disposed between each of the grounding portions and each of the bent portions, a tip end of the bent portion is bent to an upper side of the nut, and a side wall of the bent portion is brought into engagement with an outer side face of the nut to provide a swivel stop for the nut. With such a simple construction, it is possible to facilitate machining and ensure a swivel stop for each nut.

Moreover, since a cutout portion for avoiding abutment against a screw is formed in the bent tip end of each bent portion, the tip end of the bent portion can be formed in a long extended state.

Further, since the cutout portion is formed along an outer periphery of the screw and the bent tip end is extended so as to cross the screw, the bent tip end can be extended still longer, thus facilitating machining in the bending work.

What is claimed is:

1. A connector for an IC card having a circuit board, the connector comprising:

a housing with a plurality of connecting terminals attached thereto;

a shielding plate disposed on the housing the shielding plate having a grounding portion, wherein an end of the grounding portion is extended and bent to form a bent portion having a side wall portion and a tip end portion, the bent portion being configured such that a nut may be disposed between the tip end portion and a base portion of the grounding portion with the side wall portion serving to engage an outer face of the nut to provide the swivel-stop for a nut, and wherein the tip end portion of the bent portion has a cutout portion for avoiding abutment against a screw that carries the nut.

2. A connector for IC card according to claim 1, wherein the cutout portion is formed along an outer periphery of the screw, and the bent tip end is extended so as to cross the screw.

3. A IC card comprising a connector as recited in claim 1, and a circuit board on which the housing and the shielding plate are mounted.

4. An IC card comprising:

a circuit board having at least one electrical component thereon;

a housing that contains the circuit board;

a connector carried by the housing, the connector having a plurality of terminals that are electrically connected with the at least one electrical component;

a shielding plate carried by the housing, the shielding plate having a grounding portion, wherein an extended end of the grounding portion is bent to form a bent portion having a side wall portion and a tip end portion, the bent portion being configured such that a nut may be disposed between the tip end portion and a base portion of the grounding portion with the side wall portion serving to engage an outer face of the nut to provide the swivel-stop for a nut, and wherein the tip end portion of the bent portion has a cutout portion for avoiding abutment against a screw that carries the nut.

\* \* \* \* \*